DENSITY SENSING DEVICE

Filed Feb. 11, 1958 2 Sheets-Sheet 1

Inventors
STANFORD B. SILVERSCHOTZ
ELEASAR JOROW
By Percy P. Lantzy
Attorney

Inventors
STANFORD B. SILVERSCHOTZ
ELEASAR JOROW
By [signature]
Attorney

United States Patent Office 2,978,909
Patented Apr. 11, 1961

2,978,909

DENSITY SENSING DEVICE

Stanford B. Silverschotz, New York, N.Y., and Eleasar Jorow, Fort Lee, N.J., assignors to International Telephone and Telegraph Corporation, Nutley, N.J., a corporation of Maryland Filed Feb. 11, 1958, Ser. No. 714,566

5 Claims. (Cl. 73—438)

This invention relates to density sensing devices and more particularly to a device for determining changes in the density of a liquid.

In the manufacture of printed circuits, the preferred method in mass production thereof is for solder dipping of the boards in order to provide a fast and convenient method of soldering the components to the printed interconnections on the boards. For solder dipping a solder bath holding therein the liquid solder in the proper proportions of lead and tin is provided, preferably 63% tin and 37% lead. Because tin dissolves copper during soldering, forming crystals of the compound $Cu_3Sn$, the composition of the bath becomes tin poor during the course of its use. Tin-poor solders are characterized by frosty appearance and poor wetting denoting improper soldering and poor adhesion of the solder to the component leads and the printed circuit. Further, the plastic solidus phase through which the alloy passes becomes greater on both sides of the eutectic. This means that a controlled amount of tin must be added to replenish the quantity lost. Also, if too much lead is lost, as through oxidation, sufficient lead must be added to replenish that amount of lead that is lost, too much tin being as bad as too little. Maintaining the proper alloy in dip soldering of printed circuits is therefore of major importance to maintain high quality connections. The reliability required in soldering is high because of the multiplicity of joints made in each dip. The present practice to determine the correct composition of the solder bath is to remove therefrom a measured volume of the liquid solder and to weigh that sample and thereby determine which component is required to be added to the solution to bring it back to the preferred eutectic state. Such a procedure is cumbersome, time consuming, and is not sufficiently fast to react to changes in the composition of the solder which may prove detrimental to the printed circuit which are dipped therein.

It is therefore an object of this invention to provide a device to determine promptly changes in the density of a liquid which is composed of at least two components.

It is a further object of this invention to provide a system for detecting changes in the density of the liquid by providing means to add to the liquid appropriate quantities of the components of that liquid to bring that liquid back into the proper density state.

A feature of this invention is a device for determining changes in the density of a liquid comprising a pressure sensitive device responsive to the pressure variations caused by said density changes and transducing means to convert the pressure variations into a modulated signal proportional to the pressure variations.

A further feature is a system for detecting changes in the density of a liquid caused by changes in a given proportion of components of the liquid, the components thereof being continuously used up at different rates. Pressure sensitive means are provided to sense changes in the density of the liquid in response to the pressure variations in the liquid caused by these density changes.

Further means are provided to transduce said pressure variations into a modulated signal which is proportional to the pressure variations and means are provided responsive to the modulated signal to add to the liquid additional quantities of each of said components to substantially bring that liquid back into that density state where the components are in the given proportion.

The above-mentioned and other features and objects of this invention will become more apparent by reference to the following description taken in conjunction with the accompanying drawings, in which.

Figure 1:
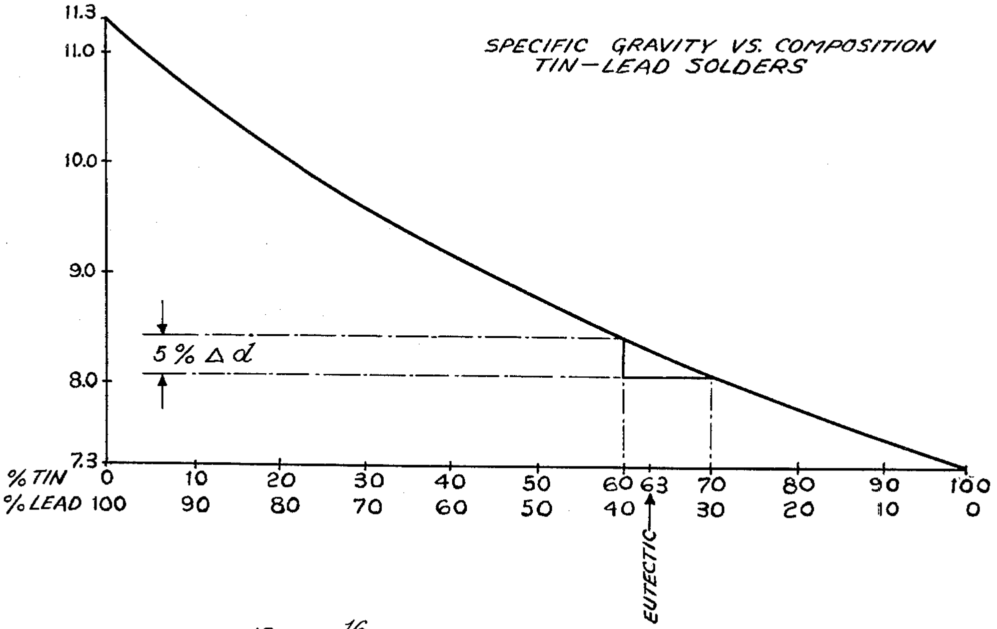
Fig. 1 is a graph showing the specific gravity vs. composition of tin-lead solders.

Referring now to Fig. 1, there is shown the specific gravity of tin-lead solders plotted against varying percentages of tin and lead. The preferred composition used in dip soldering is 63% tin and 37% lead. It has been found that a satisfactory workable range in the area of the eutectic (63% tin, 37% lead) involves a $\Delta\ d$ of approximately 5%, where the change in composition of the solder ranges from 60%–70% tin.

Figure 2:
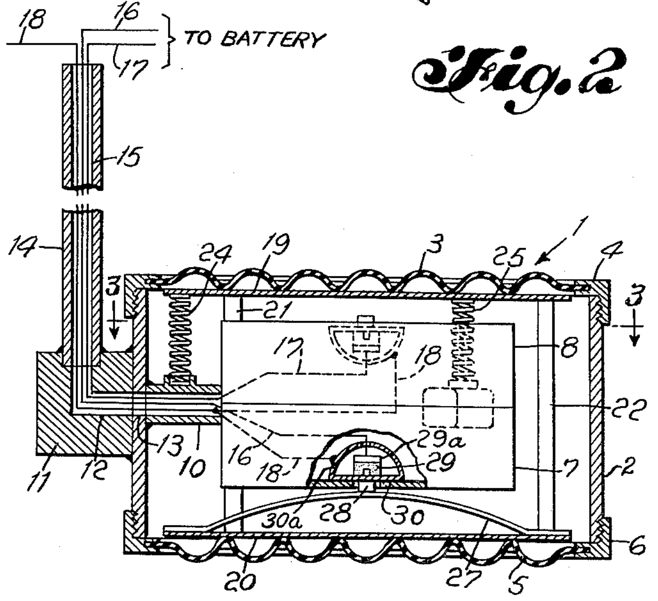
Fig. 2 is an embodiment of this invention showing the pressure sensitive device and the transducing means therein.
Figure 3:
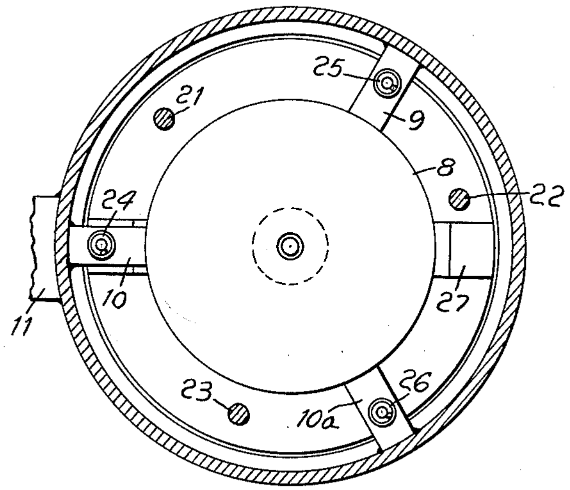
Fig. 3 is a cross section view of Fig. 2 along line 3—3.

With reference to Figs. 2 and 3, there is shown the density change determining device 1 of this invention. A hollow cylinder 2 is enclosed on the top end by a thin diaphragm 3 preferably of stainless steel which is not capable of being wetted by the solder used in solder baths. The diaphragm 3 is preferably of a concentric corrugated construction which is welded to a threaded collar 4. The concentric corrugated construction of the diaphragm 3 permits greater deflection sensitivity in response to pressure variations on the diaphragm and therefore will make the device responsive to slight changes in pressure. The threaded collar 4 is screwed on to the threaded top end of the cylinder 2, providing a solder tight seal. Likewise a diaphragm 5 welded to a threaded collar 6 is screwed on to the bottom end of cylinder 2. A first transducing device 7 preferably a carbon microphone of the type such as is used in throat microphones is disposed back to back with a second transducing device 8 of the same type as transducer 7 and having substantially the same electrical characteristics. Transducers 7 and 8 are disposed within the cylinder 2 centrally thereof and equidistant from diaphragms 3 and 5 by means of members 9, 10 and 10*a* coupling the back-to-back transducers 7 and 8 to the inner wall of the cylinder 2, said members being spaced equidistant about the center of the cylinder and substantially in the same plane. The member 10 is provided with a hollow core so that connecting leads from the transducers 7 and 8 can be passed therethrough. Opposite the member 10 and on the outside of cylinder 2 is welded a housing 11 which has a right angle channel 12 therein which abuts an opening 13 in the cylinder 2 to provide a continuous passage for the connecting leads from the transducers 7 and 8 through the member 10, the cylinder 2, and the housing 11. A relatively long cylinder 14 with a hollow center 15 is welded to the housing 11 permitting the connecting leads 16, 17, and 18 from the transducers to be brought outside of the device 1. Inside the cylinder 2 and in contact juxtaposition to the diaphragm 3 is a flat disk 19. A similarly constructed flat disk 20 is disposed in contact juxtaposition to the diaphragm 5. Equi-spaced members 21, 22 and 23 couple together disks 19 and 20 in spaced apart relation. Tension springs 24, 25, and 26 anchor disks 19 and 20 to members 9, 10, and 10*a* to substantially prevent lateral movement of the disks 19 and 20 but allowing vertical movements of the disks. An elliptically shaped actuating member 27 is welded or otherwise fastened to the inside surface of the disk 20 and the center surface of the member 27 contacts a button 28 of the carbon microphone 7, a portion of which is shown cut away to disclose carbon granules 29 contained in a cup 29*a*, a diaphragm 30 fastened to a dome 30*a*, and electrical connections 16 and 18 to the granules and the diaphragm. If more pressure is applied to the diaphragm 5 than is applied to the diaphragm 3, the differential pressure thereof will serve to force the diaphragm 5 upwards against the disk 20 which also moves the member 27 upwards against the button 28 thereby decreasing the resistance within the microphone and causing a larger current to flow. As the differential pressure is decreased, the opposite result occurs causing a greater resistance in the microphone 7 and reducing the current flow. It is apparent that when the device 1 is submerged in a liquid, there will be a different pressure on the diaphragm 3 compared with that on the diaphragm 5. Knowing the specific gravity of the preferred eutectic solder solution (63% tin, 37% lead) the tension springs 24, 25, and 26 and the contact pressure of the member 27 against the button 28 are adjusted and calibrated so that the current output from the pressure sensitive device is at a fixed reference level when the device 1 is submerged within the solder bath of that specific gravity. As the solder bath becomes deficient in tin, the specific gravity of the solution will increase thereby exerting a greater pressure on the diaphragm 5 against the button 28 causing an increase in the current flow from the transducer 7. Should the specific gravity of the solution decrease about the eutectic point, then the pressure on the button will become increasingly less causing thereby a decrease in the current output of the transducer 7. The output therefore of the device 1 is a slowly varying D.C. output which is proportional to the changes in pressure and therefore to the changes in density of the liquid.

It is possible to use two button microphones submerged in the liquid at a fixed distance apart and to take readings from both of them to determine the pressure variations. However, in this embodiment, but one operating microphone, the transducer 7 is used to sense the pressure changes. The second microphone 8 is used as a compensating microphone to compensate for the thermal coefficient of resistance of the operating microphone 7. It is necessary therefore that microphone 8 be of the same type as microphone 7 and should have as nearly as possible the same internal resistance and electrical characteristics.

Figure 4:
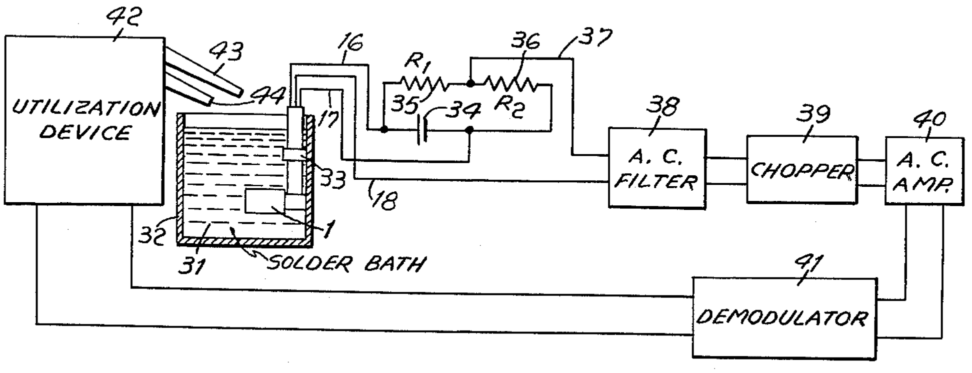
Fig. 4 is a schematic block diagram showing the pressure sensitive device with associated circuit elements used in a typical mass production soldering setup.

In Fig. 4 is shown a system for controlling the density of a solder bath utilizing the embodiment of this invention. The density sensing device 1 is shown submerged within a solder bath 31 disposed within a tank 32. The density sensing device 1 is held within the solder bath by means of a clamp 33 or similar device, at a fixed level. It should be noted that the device 1 will operate independently of the level at which it is submerged within the solder bath 31. The inner lead 16 of microphone 7 and the inner lead 17 of microphone 8 are connected to a source of D.C. voltage 34. Across the battery terminals is a resistive network composed of resistor 35 and resistor 36 in series. At the junction of resistors 35 and 36 is coupled an output lead 37. The connecting lead 18 which is coupled to the diaphragms of both transducers 7 and 8 is the other output lead of the device 1. The internal resistance of both microphones 7 and 8 together with resistors 35 and 36 constitute a Wheatstone bridge, and since microphones 7 and 8 have the same electrical characteristics and internal resistance any temperature changes that occur will affect equally both microphones so that the resistance changes due to thermal effects will be cancelled out in the Wheatstone bridge arrangement. With pressure applied to the diaphragm of microphone 7 and with the microphone 8 being held in the non-operating state, the only output of the device 1 will therefore be in response to pressure variations on the microphone 7 diaphragm. Leads 37 and 18 are connected to an A.C. filter 38 to remove thereby any A.C. component in the signal such as may be produced by the random noise action in the solder bath, sound, and thermal noise in the microphone. Only a varying D.C. signal produced by the density derived pressure of the solder bath 31 will be the output of the A.C. filter 38. Filter 38 is coupled to a chopper 39, or vibrator, to convert the D.C. into an A.C. current flow. It is to be understood, of course, that instead of using a D.C. current source such as 34 and converting the D.C. into A.C. by means of the chopper 39, an A.C. source can be used directly in place of the battery 34. The output of the chopper 39 is coupled to an amplifier 40 to raise the voltage level. The output of the amplifier 40 is fed into a demodulator 41 where the A.C. is removed by mixing with the chopper freqeuncy. The output of the demodulator 41 is coupled to a utilization device 42 which uses, for instance, relays or solenoids to operate tin feed hopper 43 or lead feed hopper 44, as the case may be, to add additional quantities of either component to the solder bath 31 in response to the varying signal output of the demodulator 41, as the various components are used up and the bath is continuously being depleted. Depending on the output level of the demodulator 41, the relays or other operating controls of the utilization device 42 may be adjusted to respond to the correct voltage of the demodulated signal. Feed control devices of the type described in general terms herein are well known in the art and it is not necessary to explain them in detail.

It is to be understood that this invention is equally suitable in a liquid wherein the temperature is greater or less than that of the liquid solder bath used in explaining the principle of this invention. It is also to be understood that the diaphragm need not be made of stainless steel but may be made of any other suitable metal or even plastic such as silicone when the temperature of the liquid, wherein the density sensing device is placed, is low enough for the diaphragm material.

While we have described above the principles of our invention in connection with specific apparatus, it is to be clearly understood that this description is made only by way of example and not as a limitation to the scope of our invention as set forth in the objects thereof and in the accompanying claims.

We claim:

1. A device for determining changes in the density of a liquid comprising a hollow body closed on the top and bottom ends by diaphragms, means coupling said diaphragms together for movement of said diaphragms in unison, a microphone having a pressure responsive element, means disposing said microphone within said body, an actuating member movable in unison with the motion of said bottom diaphragm and disposed to contact the pressure responsive element of said microphone, whereby when pressure is applied to said top and bottom diaphragms by immersion of said body within said liquid the differential pressure variations therebetween caused by density changes in said liquid will move said actuating member producing varying signals proportional to said differental pressure variations.

2. A device for determining changes in the density of a liquid comprising a hollow body closed on the top and bottom ends by diaphragms, a first disk disposed inside said body adjacent the bottom diaphragm, a second disk disposed inside said body adjacent the top diaphragm, means spacing apart said first and second disks, a microphone having a pressure responsive element, means supporting said microphone in fixed relation relative to the sidewalls of said body and disposing said microphone substantially equidistant from said top and bottom diaphragms, elastic means coupling said second disk to said means supporting said microphone and disposing said first and second disks in substantially fixed lateral relation within said body but permitting vertical displacement of said first and second disks therein, an actuating member coupled to said first disk and disposed to contact the pressure responsive element of said microphone, whereby when pressure is applied to said top and bottom diaphragms by immersion of said body within said liquid the differential pressure variations therebetween caused by density changes in said liquid will move said actuating member vertically thereby causing varying signal outputs of said microphone proportional to said differential pressure variations.

3. A device for determining changes in the density of a liquid comprising a hollow body closed on the top and bottom ends by thin diaphragms of concentric corrugated form, a first disk disposed inside said body adjacent the bottom diaphragm, a second disk disposed inside said body adjacent the top diaphragm, means spacing apart said first and second disks, a first microphone having a pressure sensitive element, a second microphone, means disposing said first and second microphones in back-to-back relation, means supporting said first and second microphones in fixed relation relative to the sidewalls of said body and disposing said first and second microphones in concentric relation substantially equidistant from said top and bottom diaphragms, elastic means coupling said second disk to said supporting means and disposing said first and second disks in substantially fixed spaced relation within said body but permitting vertical displacement of said first and second disks therein, an actuating member coupled to said first disk and disposed to contact the pressure responsive element of said first microphone, and means coupling said first and second microphones to allow said second microphone to compensate for resistance changes in said first microphone due to temperature variations in said liquid, whereby when pressure is applied to said top and bottom diaphragms by immersion of said body within said liquid the differential pressure variations therebetween caused by density changes in said liquid will move said actuating member vertically thereby causing varying signal outputs of said first microphone, said signals being proportional to said differential pressure variations.

4. A device for determing changes in the density of a liquid comprising a hollow body closed on the top and bottom ends by thin diaphragms of concentric corrugated form, means coupling said diaphragms together for movement of said diaphragms in unison a first microphone having a pressure responsive element, a second microphone, means disposing said first and second microphones in back-to-back relation, means supporting said first and second microphones in fixed relation with said body in concentric relation substantially equidistant from said top and bottom diaphragms, elastic means disposed between said micropohones and said top diaphragm, an actuating member disposed between said bottom diaphragm and said first microphone for contact with the pressure responsive element of said first microphone, and means coupling said first and second microphones to allow said second microphone to compensate for resistance changes in said first microphone due to temperature variations in said liquid, whereby when pressure is applied to said top and bottom diaphragms by immersion of said body within said liquid the differential pressure variations therebetween caused by density changes in said liquid will move said actuating member vertically thereby causing varying signal outputs of said first microphone, said signals being proportional to said differential pressure variations.

5. A device for determining changes in the density of a liquid comprising a hollow body closed on top and bottom ends by diaphragms deflectively responsive to pressure variations caused by said density changes, means coupling said diaphragms together for movement of said diaphragms in unison, transducing means including first and second microphones disposed within said body, said first microphone being responsive to said deflections of at least one of said diaphragms to produce an output proportional to said deflections, said second microphone having substantially the same characteristics as said first microphone, means coupling said first microphone to said second microphone whereby said second microphone compensates for resistance changes in said first microphone due to temperature variations in said liquid and the output of said transducing means is a modulated signal proportional to said pressure variations.

References Cited in the file of this patent

UNITED STATES PATENTS

| | | |
|---|---|---|
| 1,681,314 | Vawter | Aug. 21, 1928 |
| 2,357,639 | Elias | Sept. 5, 1944 |
| 2,434,098 | Bays | June 6, 1948 |
| 2,651,939 | Weaver | Sept. 15, 1953 |